US006750651B2

(12) United States Patent
Overall

(10) Patent No.: US 6,750,651 B2
(45) Date of Patent: Jun. 15, 2004

(54) FAT SUPPRESSION IN MRI USING OSCILLATING STEADY-STATE FREE PRECESSION

(75) Inventor: William R. Overall, Menlo Park, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 10/190,139

(22) Filed: Jul. 3, 2002

(65) Prior Publication Data

US 2004/0004476 A1 Jan. 8, 2004

(51) Int. Cl.[7] .................................................. G01V 3/00
(52) U.S. Cl. ....................................................... 324/309
(58) Field of Search ................................ 324/300, 307, 324/309; 600/410

(56) References Cited

U.S. PATENT DOCUMENTS

| | | | |
|---|---|---|---|
| 3,824,452 A | | 7/1974 | Freeman et al. |
| 4,115,730 A | | 9/1978 | Mansfield |
| 4,706,024 A | * | 11/1987 | Dumoulin ..................... 324/309 |
| 4,893,080 A | * | 1/1990 | Luyten et al. ............... 324/309 |
| 4,999,580 A | | 3/1991 | Meyer et al. |
| 5,256,967 A | | 10/1993 | Foo et al. |
| 5,347,216 A | | 9/1994 | Foo |
| 5,422,572 A | * | 6/1995 | Yao ............................. 324/309 |
| 6,046,588 A | * | 4/2000 | Watanabe ..................... 324/307 |
| 6,054,853 A | * | 4/2000 | Miyamoto et al. ........... 324/309 |
| 6,064,203 A | * | 5/2000 | Bottomley ................... 324/309 |
| 6,078,176 A | * | 6/2000 | McKinnon .................... 324/309 |
| 6,307,368 B1 | | 10/2001 | Vasanawala et al. |
| 6,329,821 B1 | * | 12/2001 | Zhou ............................ 324/318 |
| 6,339,332 B1 | | 1/2002 | Deimling |
| 6,380,738 B1 | * | 4/2002 | Zhou ............................ 324/309 |
| 6,493,569 B2 | * | 12/2002 | Foo et al. ..................... 600/410 |
| 6,552,542 B1 | * | 4/2003 | Overall ........................ 324/309 |
| 6,586,933 B1 | * | 7/2003 | Hardy et al. ................. 324/307 |
| 6,587,708 B2 | * | 7/2003 | Venkatesan et al. ......... 600/419 |

OTHER PUBLICATIONS

D. Natroshvili; "Two–Dimensional Steady–State Oscillation Problems of Anisotropic Elasticity"; Georgian Mathematical Journal, vol. 3, No. 3 1996, 239–262.*

Gary Ayton et al.; "On the Asymptotic Convergence of the Transient and Steady State Fluctuation Theorems";http\.www.arxiv.org/pdf/cond–mat/9903409 Australian National University; 1999; pp. 1–8.*

Xiaolin Zhao et al., B0–Fluctuation–Induced Temporal Variation in EPI Image Series Due to the Disturbance of Steady–State Fre Procession; Magnetic Resonance in Medicine 44, 2000; 758–765.*

* cited by examiner

Primary Examiner—Edward Lefkowitz
Assistant Examiner—Dixomara Vargas
(74) Attorney, Agent, or Firm—Beyer Weaver & Thomas, LLP

(57) ABSTRACT

A method of generating MRI signals with fat suppressed steady state free precession (SSFP) contrast without requiring any additional scan time over standard SSFP procedures and with comparable signal to noise ratio (SNR) to other techniques. Oscillating steady state free precession is employed to achieve the fat suppressed MRI signals. In the oscillating steady state sequence, a pattern of tips and precession is repeated every $N_{tips}$ repetition time in order to produce useful contrasts. In a described embodiment, a specific oscillating sequence has four tips in a repetition interval with four steady states being produced. With equal precession in each repetition time, the sequence of complex tips can be determined by an inverse Shinnar-LeRoux (SLR) transform.

18 Claims, 6 Drawing Sheets

FAT SUPPRESSION IN MRI USING OSCILLATING STEADY-STATE FREE PRECESSION

STATEMENT AS TO RIGHTS TO INVENTIONS MADE UNDER FEDERALLY SPONSORED RESEARCH OR DEVELOPMENT

The U.S. Government has rights in the disclosed invention pursuant to NIH Grant HL07846 to Stanford University.

BACKGROUND OF THE INVENTION

This invention relates generally to magnetic resonance imaging (MRI), and more particularly the invention relates to MRI in which signal from fat is suppressed.

Refocused steady-state free precession (SSFP) experiments provide high SNR in relatively short scan times, but often suffer from extremely bright signal from fat. In many clinical applications of MR, bright fat signal can interfere with the desired signal (from water), making diagnosis more difficult.

Several techniques exist for fat suppression in non-refocused ("spoiled") imaging experiments, but these methods are incompatible with refocused SSFP. Recently, a few techniques have been proposed that can suppress fat in refocused-SSFP sequences, but most require an increase in scan time, and can suffer from inconsistent or incomplete fat suppression. See, for example, Vasanawala et al. U.S. Pat. No. 6,307,368; Deimling U.S. Pat. No. 6,339,332; and Scheffler et al., Magn Reson Med, 45 (6); 1075–1080, 2001.

The present invention is directed to a method of generating image with fat-suppressed SSFP contrast without requiring any additional scan time over standard SSFP procedures and with comparable signal-to-noise ratio (SNR) to other techniques.

BRIEF SUMMARY OF THE INVENTION

In accordance with the invention, oscillating steady-state free precession is employed to achieve fat suppression in MRI signals. The invention is particularly useful for fat suppressed images in areas of motion such as the heart, where rapid imaging is imperative in order to reduce motion-related signal artifacts. The method can be more robust than current techniques, making it an attractive alternative for clinical use in a variety of studies including cartilage imaging, abdominal imaging, and coronary artery imaging, for example.

Briefly, in an "oscillating" steady state sequence, a pattern of tips and precession is repeated every Ntips TRs in order to produce useful contrast. In one embodiment, a specific oscillating sequence has Ntips=4, but sequences with other repetition intervals that generate interesting contrast can be used. With a repetition interval of 4·TR, four distinct steady states are produced.

The invention and objections and features thereof will be more readily apparent from the following detailed description and dependent claims when taken with the drawings.

DETAILED DESCRIPTION OF THE INVENTION

The use of oscillating dual-equilibrium steady state equilibrium in MRI is known. See, for example, patent application Ser. No. 09/967,644 filed Sep. 28, 2001, now U.S. Pat. No. 6,552,542, for "Oscillating Dual-Equilibrium Steady State Angiography using Magnetic Resonance Imaging," which uses refocused SSFP sequences such that flowing material reaches a steady state that oscillates between two equilibrium values, while stationary material attains a standard, non-oscillating steady state. When alternating sequences are employed, subtraction of adjacent echoes results in larger, uniform signal from all flowing spins and zero signal from stationary spins.

The present invention utilizes the difference in precession between fat and water to provide a filter based on oscillating SSFP that effectively removes signals precessing at the resonant frequency of fat.

Figure 1A:
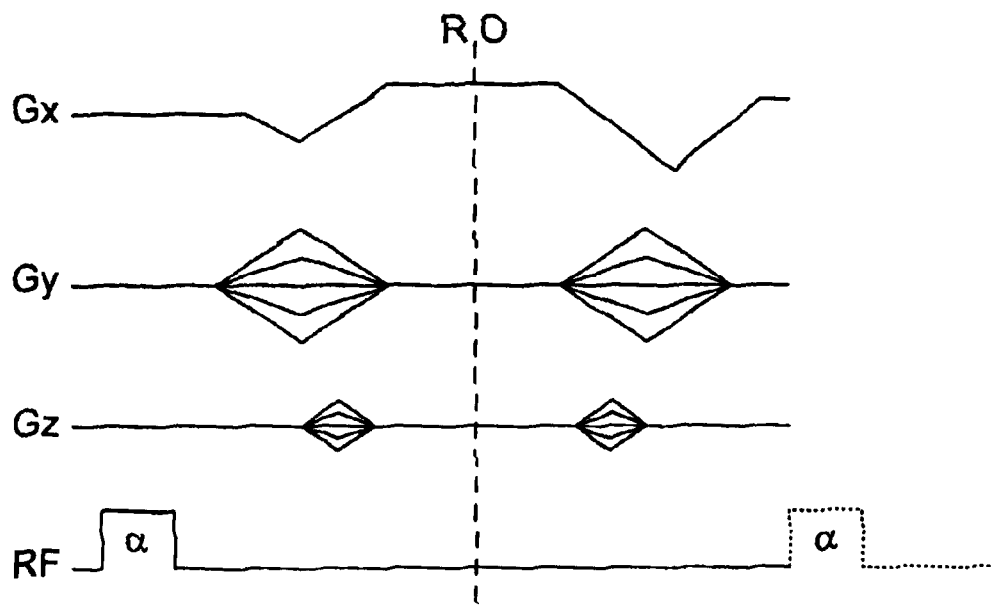
FIGS. 1A, 1B are pulse sequence diagrams for a 3-D and for a 2-D refocused-SSFP process.
Figure 1B:
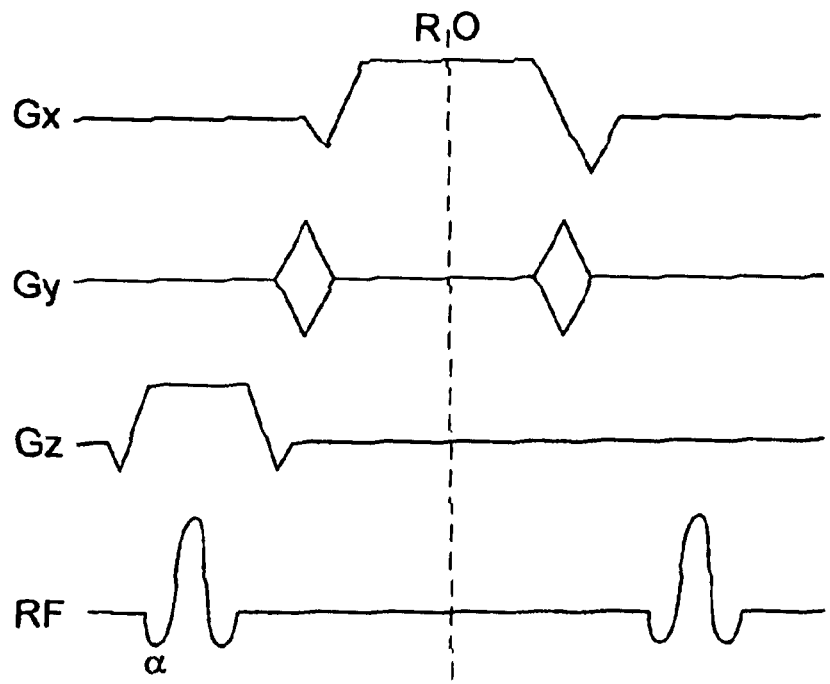

FIGS. 1A, 1B are pulse sequence diagrams for 3D and 2D refocused SSFP imaging. After applying an RF excitation pulse, gradients are applied to effect a refocused readout. The sequence is repeated for a series of echoes and for a plurality of tips in each sequence.

Figure 2:
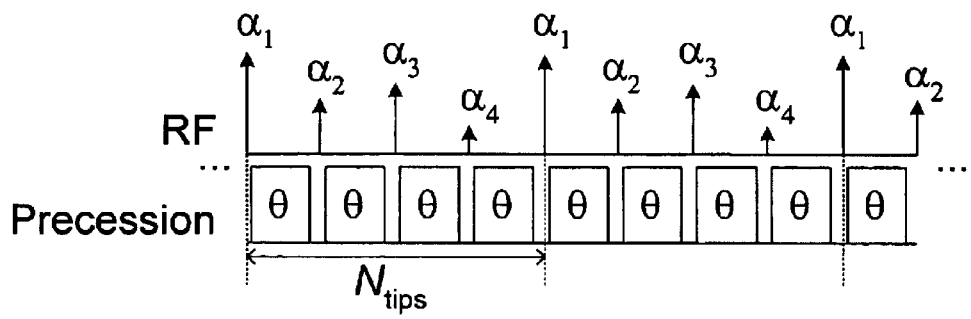
FIG. 2 illustrates an OSSFP process in accordance with one embodiment of the invention having a sequence of four tips to process a desired profile.

FIG. 2 illustrates an oscillating steady state sequence with a repetition interval having four tips. In this oscillating steady state sequence, a pattern of tips and precession is repeated every Ntips TR's in order to produce useful contrast. In one embodiment, a specific oscillating sequence has four tips, but sequences with other repetition intervals can be used.

If precession (θ) is equal in each TR, the sequence of complex tips $\{\alpha_n\}$ can be determined by the inverse Shinnar-Le Roux (SLR) transform [5]. Complex-valued polynomials A(z) and B(z) must be designed to satisfy $$A(e^{j\theta}) = \cos\left[\frac{\phi(\theta)}{2}\right] - jm_z(\theta)\sin\left[\frac{\phi(\theta)}{2}\right] \quad (2.1)$$

$$B(e^{j\theta}) = -j[m_x(\theta) + jm_y(\theta)]\sin\left[\frac{\phi(\theta)}{2}\right],$$

where φ(θ) is the total tip experienced by a spin during the interval spanned by $N_{tips}$, and m(θ) is a vector representing the axis of that composite tip. In order to design for a specific steady-state magnetization $M_{ss}(\theta)$ (which appears every $N_{tips}$ TRs), we note that $M_{ss}(\theta)$ lies along the axis m(θ):

$$M_{ss}(\theta) = Km(\theta),$$

where 0≤K≤1, and $T_1$ recovery has been neglected. Thus, the desired, steady-state direction can be specified through m(θ). The remaining unknown in Eq. 2.1, φ(θ), is removed by defining $$H(z) \equiv \frac{\text{Im}ag\{A(z)\}}{B(z)} = \frac{M_{ss_z}}{jM_{ss_x} - M_{ss_y}}.$$

A(z) can then be specified in terms of H(z):

$$|A(z)|^2 = \frac{|H(z)|^2}{|H(z)|^2 + \sin^2[\angle A(z)]}, \quad (2.2)$$

where ∠A(z) is an unknown angle that can be found by iteration.

In each iteration, the desired A(z) is specified using Eq. 2.2, then fit to a polynomial $A_p(z) \approx A(z)$ using a weighted least-squares inversion with weights w(θ)=1/sin [φ(θ)/2]. These weights assure that the specified polynomial $A_p(z)$ minimizes mean-squared error in $M_{ss}(\theta)$ rather than in A(z). The polynomial phase $\angle A_p(z)$ is then used to recalculate A(z) in Eq. 2.2; this process repeats until convergence. Since $B_p(z)$ is analytic, the minimum-phase $B_p(z)$ is uniquely determined by $A_p(z)$ Once polynomials $A_p(z)$ and $B_p(z)$ are found, the inverse SLR transform can be used to derive the sequence of complex tips $\{\alpha_n\}$. In this way, the problem of specifying tips that generate a desired signal profile as a function of frequency is reduced to a simpler polynomial-design problem.

In practice, the synthesis procedure always converges, and usually in fewer than 10 iterations. Computation takes just a few seconds regardless of $N_{tips}$. The solution is not strongly dependent on the initial $\angle A_p(z)$.

One filter sequence designed by this algorithm with $N_{tips}$=4 has tip magnitudes of $\{50_y°, 50_y°, 50_y°, 150_{-y}°\}$. This sequence produced 67% more SAR than the corresponding 30°-SSFP sequence with the same TR. If necessary, SAR constraints can be incorporated into the synthesis problem in order to produce more manageable pulses. These tips can also be scaled down at the expense of stopband suppression.

Figure 3A:
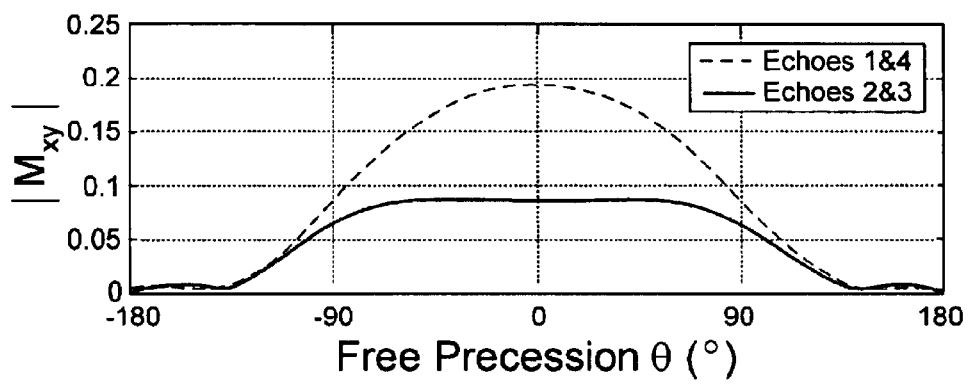
FIGS. 3A, 3B illustrate a FS-OSSFP sequence having four distinct echoes occurring in equal magnitude pairs and the steady state magnetization symmetrically distributed about the z axis, respectively.
Figure 3B:
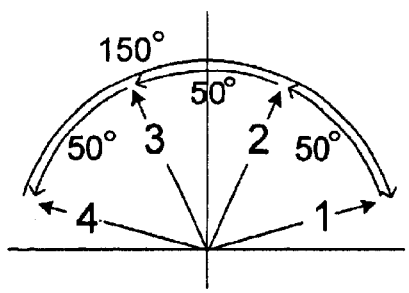

The progression of magnetization after each tip in this sequence is shown in FIG. 3B. Signal magnitudes at each echo for the FS-OSSFP sequence are shown in FIG. 3A. The tip constraint that $\alpha_1=\alpha_3$ insures that echoes occur in equal-magnitude pairs. Acquisitions could be repeated for each unique echo similarly to FEMR (resulting in a doubling of scan time); however, scan time can be minimized by adjusting amplitudes and phases to equalize signal at each echo. Each phase-encode can then be acquired just once, resulting in no additional scan time, but possible artifacts or noise coloration due to equalization. Phase-encodes near the center of k-space are acquired on high-signal echoes in order to maximize apparent SNR.

In order to use this filter sequence for fat suppression, the repetition interval TR of the sequence must be set to place fat into the stopband of the filter response (θ=180°). At 1.5 T, fat processes 220 Hz slower than water; therefore, TR=2.3 ms is optimal. Since the FS-OSSFP stopband is broad and flat, a slightly longer TR may be used if practical considerations require it.

Images were acquired on a 1.5 T GE Signa research system with 40 mT/m gradients switchable at 150 mT/ms (GE Medical Systems, Waukesha, Wis.). For all studies, a 3D volume was imaged at 256×256×32 resolution, with an isotropic 32-cm FOV. Fractional readouts covered 60% of k-space in 616 µs; TR and TE were 3.0 ms and 1.5 ms, respectively. 3D imaging time was 25 s for SSFP and FS-OSSFP, and 50 s for FEMR.

Figures 4A, 4B, 4C:
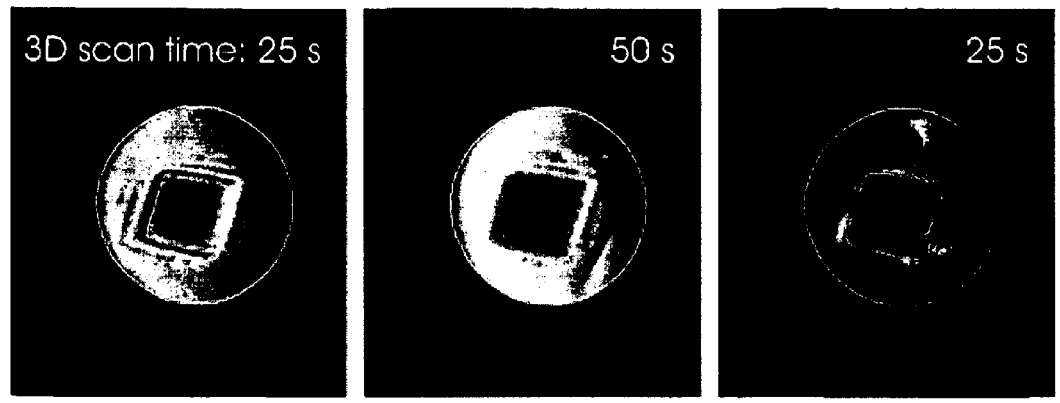
FIGS. 4A–4C illustrate reconstructed images of a butter and water phantom using standard SSFP, FEMR, and FS-OSSFP in accordance with the invention.

FIGS. 4A–4C show results of the three techniques in a butter-and-water phantom. Standard SSFP produces a high-SNR image with bright fat signal. FEMR reduces fat signal while maintaining high SNR, but requires twice the scan time. FS-OSSFP images show near-complete fat suppression with a small reduction in SNR, and require no additional scan time.

Techniques for suppressing fat in SSFP sequences have been proposed by Vasanawala et al. (U.S. Pat. No. 6,307,368), Scheffler et al., supra, and Deimling (U.S. Pat. No. 6,339,332). Here, each of these techniques will be briefly described and contrasted with FS-OSSFP.

Figure 5:
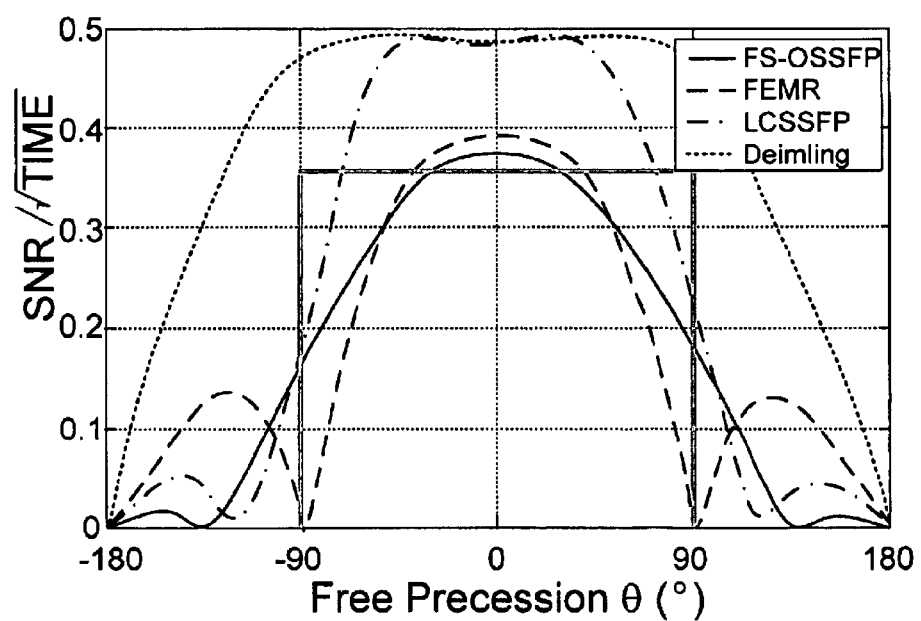
FIG. 5 illustrates simulated FS-OSSFP SNR versus precession $\theta$ as compared with the prior art techniques of FEMR, LCSSFP, and the Deimling method.

Of the methods previously described, Deimling's is the simplest. This method proposes using a simple refocused-SSFP pulse sequence, and making use of the naturally occurring SSFP signal null at θ=180° to suppress signal (see FIG. 5). As with FS-OSSFP, this method requires a TR of 2.3 ms for optimal operation at 1.5T. It is also the only one of the previously described techniques that does not require any additional scan time over standard SSFP (and therefore would require exactly the same amount of time as FS-OSSFP). The primary disadvantage of this technique as compared with FS-OSSFP is its extremely narrow stopband. As seen in FIG. 5, this technique has a stopband with a width of less than 45° of precession. Since spin coupling and magnet inhomogeneity tend to broaden the bandwidth of fat spins, this narrow stopband is not sufficient for complete fat suppression in most circumstances. The FS-OSSFP technique has a much broader stopband, resulting in more-complete fat suppression as well as increased robustness to TR variations, magnet inhomogeneity, and other imperfections.

Vasanawala et al. described two methods; the first, LCSSFP, represents an extension of Deimling's method. In LCSSFP, n standard-SSFP scans are performed, each with a slightly different center frequency. This has the effect of sweeping the narrow stopband over the entire range of off-resonant precession. The separate acquisitions can then be linearly combined to produce a composite image with a resonant-frequency stopband over a wider range of frequencies (shown for n=2 in FIG. 5).

Since this technique requires n separate SSFP acquisitions, it will also require n times as long as FS-OSSFP to complete. And since not all of the acquisitions provide useful signal in the SSFP passband, the added acquisitions do not provide a corresponding SNR improvement in the passband. Furthermore, the linear combination of multiple images acquired at different times makes this technique particularly susceptible to artifacts from subject motion during data acquisition.

The other method proposed by Vasanawala et al., FEMR, is similar to FS-OSSFP in that it uses a schedule of four tips in an oscillating-SSFP sequence to generate fat-suppressed images. The FEMR tips are $\{\beta_y°, \beta_y°, \beta_{-y}°, \beta_{-y}°\}$, where the tip angle $\beta°$ can be adjusted for image contrast. The FEMR response is plotted alongside FS-OSSFP in FIG. 5.

This technique has two primary disadvantages as compared with FS-OSSFP. First, only every other echo is fat suppressed; alternate echoes are water-suppressed instead. Therefore, this method requires double the scan time of FS-OSSFP for fat-suppressed imaging. The other drawback is incomplete suppression in the stopband, as seen in 5. FS-OSSFP produces much less stopband signal than FEMR, resulting in more-complete fat suppression. This theoretical assertion is supported by the experimental results in FIG. 4, where FEMR exhibits significantly more fat signal than FS-OSSFP.

The method proposed by Scheffler et al. uses periodically inserted fat-saturation pulses to reduce fat signal. This technique requires more time than FS-OSSFP, with the exact time increase dependent upon the rate of repetition of the fat-saturation pulses. As described by Scheffler, the technique requires 1.16× as long as FS-OSSFP. In addition, a consistent steady state is never achieved; therefore, artifacts and incomplete fat suppression can be expected due to transient magnetization during the scan. Finally, the technique is more difficult to implement because of multiple parameters that must be set manually for ideal performance.

The novel portion of the described pulse sequence is a set of RF tips, and as such, a host of modifications could be made to optimize the sequence under various circumstances. The primary tip requirement for the filter-like response is that $\alpha_1+\alpha_2+\alpha_3=\alpha_4$. For echoes to occur in equal-magnitude pairs, the requirement is that $\alpha_1=\alpha_3$. Since the sequence repeats itself, any circular permutation on this tip sequence would be equivalent.

Figures 6A, 6B:
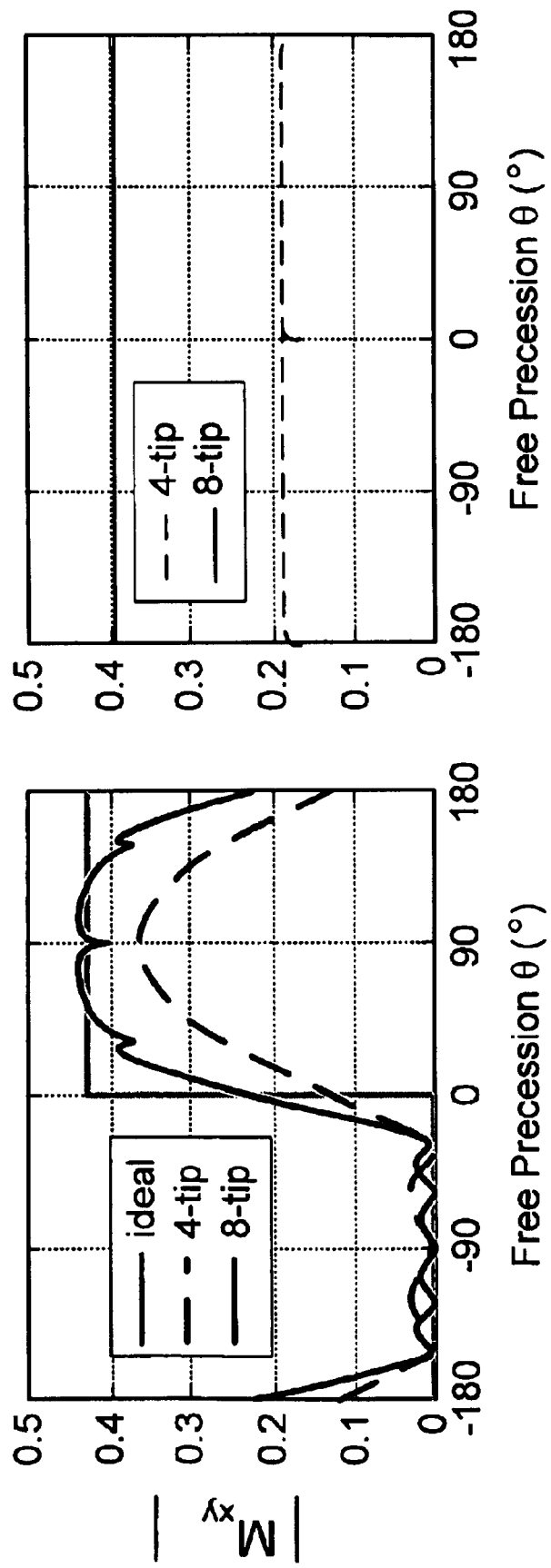
FIGS. 6A, 6B are graphs illustrating signal magnitude versus precession for frequency-selective and uniform filters designed by steady state sequence synthesis.

The synthesis algorithm can be used to generate different results than those described here. With appropriate weighting, the least-squares minimization can be set to emphasize either stopband suppression or passband signal maximization. If weighting is used to emphasize passband signal maximization, then filters similar to those in FIG. 6A are produced. The 4-tip passband-maximizing sequence has tip magnitudes of $\{65_y°, 40_{-y}°, 65_y°, 90_{-y}°\}$.

The synthesis procedure can also be used to generate arbitrary frequency responses, not just filters. In this way, sequences with uniform responses as a function of precession have been designed (FIG. 6B). Solutions to this problem with $N_{tips}=4$ are of the form $\{\psi_y°, 0°, (180-\psi)_y°, 180_{-y}°\}$, where $\psi$ depends on the desired signal magnitude. When $\psi=90°$, this resembles a driven-equilibrium sequence; however, when recovery time is short compared to $T_1$, smaller values of $\psi$ maximize overall signal. This could be useful for imaging with SSFP-like contrast without the banding artifacts usually associated with such imaging. Such a sequence would not require the extremely short TRs necessitated by standard refocused SSFP.

Also depicted in FIG. 6B is the fact that $N_{tips}$ can be increased to produce filters with flatter passbands and sharper cutoffs. In addition, average SAR tends to decrease as $N_{tips}$ increases. However, these additional tips produce more independent steady states, and more post-processing is required to equalize each echo.

As presented, this algorithm may introduce artifacts because of the echo magnitude equalization that is required to maintain the same scan time as standard SSFP. If minimizing scan time is not a priority, these artifacts can be removed by re-acquiring each phase-encoding line at every unique echo, then reconstructing multiple unique images, each fat suppressed. These images can then be summed to increase overall SNR without introducing any artifacts.

Figure 7:
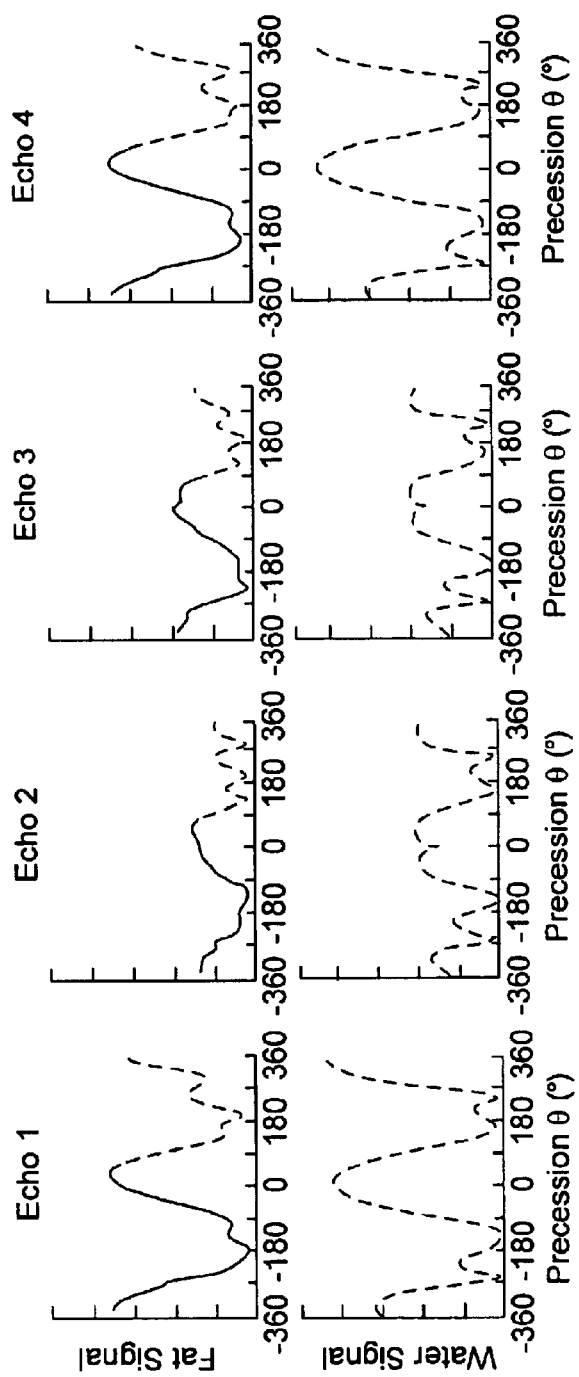
FIG. 7 is graphs of FS-OSSFP signal versus off-resonant precession for each of four echoes and for both lipid (top) and water (bottom) phantoms.

FIG. 7 shows signal as a function of off-resonant precession for each of the four FS-OSSFP echoes in both fat and water phantoms. In all cases, results match qualitatively with those predicted by theory (FIG. 3A). Signal in echoes 1 and 4 is close to 2.3 times larger than that in echoes 2 and 3. In some cases, signal fluctuations are apparent at the middle of the passband; these will be explored in greater detail below.

Figure 8:
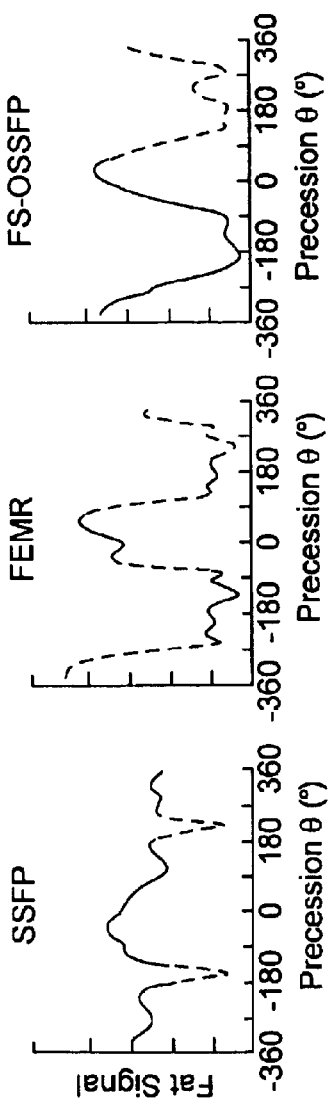
FIG. 8 is graphs illustrating signal versus off-resonant precession in a lipid phantom for SSFP, FEMR, and FS-OSSFP.
Figure 9A:
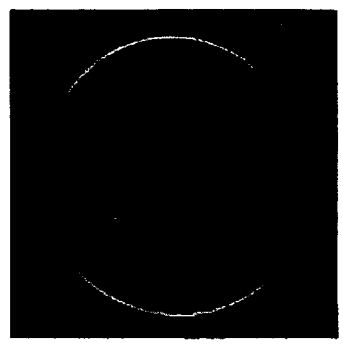
FIGS. 9A–9F are FS-OSSFP images of a waterball phantom exhibiting a band artifact through the center of the passband.
Figure 9B:
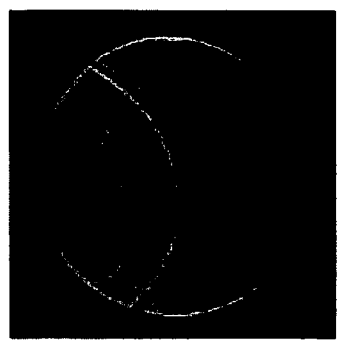
Figure 9C:
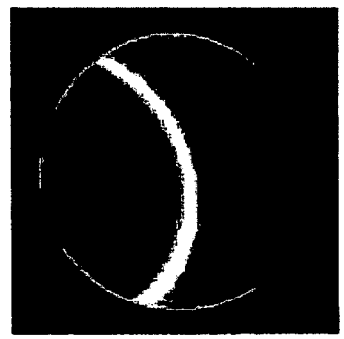
Figure 9D:
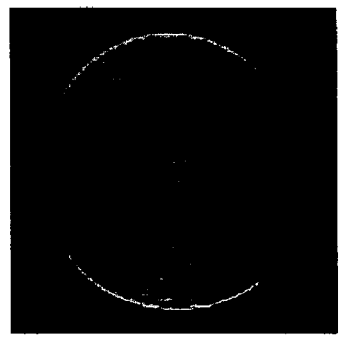
Figure 9E:
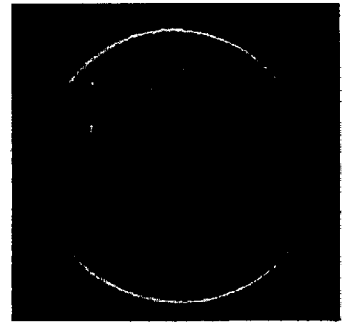
Figure 9F:
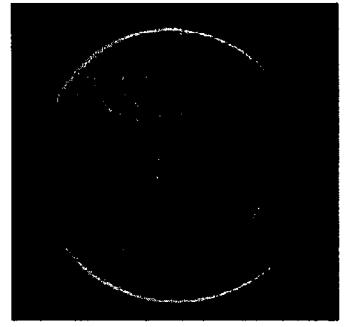

For comparison, signal profiles were also generated for SSFP and FEMR sequences (FIG. 8) in the same lipid phantom. Both of these techniques exhibit significant variations in signal strength over the passband, an effect that could possibly be attributed to proton spin decoupling. The transition between passband and stopband is sharper in the FEMR experiment, but both techniques provide a region of low signal that should be broad enough for effective lipid suppression. The peak passband signal strength is similar in each of the three techniques, indicating that apparent SNR should be comparable to that of conventional SSFP imaging.

FIG. 9 shows a cropped single slice from a 3D FS-OSSFP scan performed in a water phantom. Each of the images reconstructed from the four individual echoes exhibits a characteristic stripe across it; this represents the same effect that produced the signal fluctuations at the center of the passband in FIG. 7. These echoes could be combined to generate a full-data reconstruction, or echoes could be equalized and combined as described in the Theory section above (requiring just one quarter the scan time). The equalized image (shown in FIG. 9e) is nearly free of the signal fluctuations. Equalization error, calculated as the absolute difference between the equalized image and the full-data reconstruction, is appreciable only near the FS-OSSFP stopband (at left in FIG. 9).

Figure 10A:
FIGS. 10A–10C are reconstructed images of the leg of a normal volunteer using FS-OSSFP, FEMR and standard SSFP, respectively.
Figure 10B:
Figure 10C:
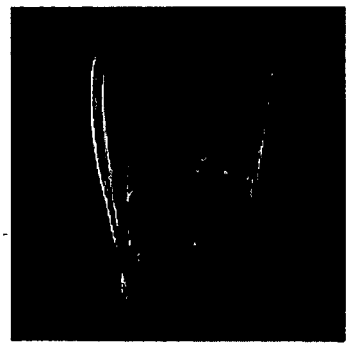

In the leg of a normal volunteer, FS-OSSFP provides superior fat suppression to either FEMR or standard SSFP (FIG. 10). The femoral artery is well-visualized in the FS-OSSFP image, with nearby lipid signal greatly reduced. Some aliasing from the other leg is visible in the FS-OSSFP scan; since larger tip angles are utilized in FS-OSSFP, the effective coil excitation region grows. For this reason, care should be taken to adequately separate potential sources of aliased signal from the coil.

Images acquired with FS-OSSFP show good agreement with theoretical predictions. Signal profiles in FIG. 7 reveal stopband signal around 10% of maximum. Localized regions of slightly higher stopband signal (for example, in the right-hand stopband of the fat signal in FIG. 7) are likely due to tip inhomogeneity. Simulations show that tip inconsistency of up to 25% can be tolerated while still maintaining stopband suppression at a level around 20% of maximum.

Another characteristic of the FS-OSSFP signal profile is a narrow range of either enhanced or suppressed signal at the center of the signal passband (see, for example, the images of individual echoes in FIG. 9). While scaled RF power can cause a loss of stopband suppression, as seen above, inconsistencies in the passband are due to nonlinearity in the RF subsystem. Nonlinearities cause errors in the ratio between various tips in the pulse sequence and could be avoided by carefully calibrating the 150° tip to be exactly three times as strong as each of the 50° tips. In practice, however, this effect is minimized by the use of equalization. Echo pairs in FS-OSSFP have complementary artifacts of this sort, so combining echoes to generate a single image effectively removes the artifact (see FIG. 9e).

Though equalization tends to reduce stripe artifacts in images, it can also generate artifacts when signal from the individual echoes are not exactly scaled replicas of one another. This primarily occurs far from the center of the passband, where signal that is not fully suppressed is scaled by a factor of 2.3. The assumption that equal-magnitude echoes also have equal phase is also violated when signal magnitude is small near the stopband. Both of these effects tend to reduce coherent signal from equalized FS-OSSFP in regions near the stopband. Since stopband suppression is desired, this loss of signal is actually beneficial; however, the lost signal can cause ghosting artifacts along the innermost phase-encoding direction. To minimize these potential artifacts, the order of phase-encoding lines could be randomized so that coherent ghosts don't arise.

Another effect of echo equalization is the potential for reduced SNR due to noise coloration. The equalized image shown in FIG. 9(e) has a measured SNR of 268. This is somewhat lower than the SNR of 334 measured from the image employing just the first echo. The loss in SNR is due to enhanced noise contributions from high-frequency phase-encoding lines.

The FS-OSSFP sequence described here has very good stopband suppression, but passband signal is lower than that of other SSFP sequences. If additional signal is desired, stopband suppression can be traded off for passband signal by appropriately modifying the least-squares weights in the iterative procedure. For enhanced passband signal, stopband weights should be multiplied by a scaling factor f<1.

Average SAR can also be high for sequences produced with this method. One simple way of limiting SAR is to constrain A(z) to be minimum-phase; this results in a set of RF pulses that minimize energy for a given off-resonant response. If further SAR reduction is necessary, the first coefficient of the $A_p(z)$ polynomial, No (which is inversely proportional to average RF power), can be constrained in the least-squares optimization to be above a particular value.

There has been described a method for fat suppression in MRI using oscillating steady state free precession. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of fat suppression in magnetic resonance imaging comprising the steps of:
   a) placing an object to be imaged in a static magnetic field,
   b) sequentially applying a plurality of RF pulses to the object whose amplitudes and phases and repetition intervals are chosen to detect an echo from water but no echo from fat, wherein each plurality of pulses provides a magnetization tip with a progression of magnetization tip and a return of magnetization to the same value at the beginning of each plurality of pulses,
   c) detecting at a time period after at least some of the RF pulses an echo as a readout signal through the application of axial gradients, and
   d) repeating the plurality of RF pulses as necessary to provide steady state echoes which oscillate between at least two values.

2. A method of fat suppression in magnetic resonance imaging comprising the steps of:
   a) placing an object to be imaged in a static magnetic field,
   b) sequentially applying a plurality of RF pulses to the object whose amplitudes and phases and repetition intervals are chosen to detect an echo from water but no echo from fat, wherein each plurality of pulses provides a magnetization tip in equal increments with a progression of magnetization tip in equal increments and a return of magnetization to the same value at the beginning of each plurality of pulses,
   c) detecting at a time period after at least some of the RF pulses an echo as a readout signal through the application of axial gradients, and
   d) repeating the plurality of RF pulses as necessary to provide steady state echoes which oscillate between at least two values.

3. The method as defined by claim 2, wherein the number of pulses in each sequence is four.

4. The method as defined by claim 3, wherein the first RF pulse ($\alpha_1$) is equal in magnitude to the fourth RF pulse ($\alpha_4$) and the second RF pulse ($\alpha_2$) is equal in magnitude to the third RF pulse ($\alpha_3$).

5. The method as defined by claim 4, wherein each sequence of pulses has tip magnitudes of 50°, 50°, 50°, −150°.

6. The method as defined by claim 5, wherein amplitude and phase of the RF pulses are determined by inverse Shinnar-LeRoux (SLR) transform.

7. The method as defined by claim 2, wherein amplitude and phase of the RF pulses are determined by inverse Shinnar-LeRoux (SLR) transform.

8. The method as defined by claim 7, wherein the number of pulses in each sequence is four.

9. The method as defined by claim 8, wherein the plurality of pulses in step b) is for three-dimensional imaging.

10. The method as defined by claim 8, wherein the plurality of pulses in step b) is for two dimensional imaging with shaped RF pulses used for slice selection.

11. The method as defined by claim 2, wherein the plurality of pulses in step b) is for three dimensional imaging.

12. The method as defined by claim 2, wherein the plurality of pulses in step b) is for two dimensional imaging with shaped RF pulses used for slice selection.

13. The method as defined by claim 2, wherein the static field is approximately 1.5 Tesla, and the repetition time (TR) is approximately 2.3 ms.

14. A method of filtering MRI signals based on differences in resonant frequencies of different signal sources such as water and fat to suppress signal from fat comprising the steps of:
   a) placing an object to be probed in a static magnetic field,
   b) sequentially applying a plurality of RF pulses to the object whose amplitudes and phases and repetition intervals are chosen to detect a selected range of frequencies and reject other frequencies, wherein each plurality of pulses provides a magnetic tip with a progression of magnetization and a return to magnetization to the same value at the beginning of each plurality of pulses,
   c) detecting at a time period after all or a subset of the RF pulses an echo as a readout signal, wherein each RF pulse is followed by axial gradients for detection of imaging signals,
   d) repeating the plurality of RF pulses as necessary to provide steady state echoes which oscillate between at least two values.

15. The method as defined by claim 14, wherein each RF pulse is followed by axial gradients for detection of imaging signals.

16. A method of filtering MRI signals based on differences in resonant frequencies of different signal sources such as water and fat to suppress signal from fat comprising the steps of:

a) placing an object to be probed in a static magnetic field, b) sequentially applying a plurality of RF pulses to the object whose amplitudes and phases and repetition intervals are chosen to detect a selected range of frequencies and reject other frequencies, wherein each plurality of pulses provides a magnetic tip with a progression of magnetization in equal increments and a return to magnetization to the same value at the beginning of each plurality of pulses, and each RF pulse is followed by axial gradients for detection of imaging signals, c) detecting at a time period after all or a subset of the RF pulses an echo as a readout signal, wherein each RF pulse is followed by axial gradients for detection of imaging signals, and d) repeating the plurality of RF pulses as necessary to provide steady state echoes which oscillate between at least two values.

17. The method as defined by claim 16, wherein the number of pulses in each sequence is four.

18. The method as defined by claim 17, wherein the first RF pulse ($\alpha_1$) is equal in magnitude to the fourth RF pulse ($\alpha_4$) and the second RF pulse ($\alpha_2$) is equal in magnitude to the third RF pulse ($\alpha_3$).

* * * * *